United States Patent [19]

Tisinger

[11] Patent Number: 5,270,585
[45] Date of Patent: Dec. 14, 1993

[54] OUTPUT DRIVER STAGE WITH TWO TIER CURRENT LIMIT PROTECTION

[75] Inventor: Eric W. Tisinger, Chandler, Ariz.
[73] Assignee: Motorola, Inc., Schaumburg, Ill.
[21] Appl. No.: 919,324
[22] Filed: Jul. 27, 1992
[51] Int. Cl.$^5$ ............................................. H03K 17/12
[52] U.S. Cl. ..................... 307/443; 307/265; 307/270; 307/273; 307/475
[58] Field of Search ............... 307/443, 448, 475, 265, 307/270, 273, 480; 361/94

[56] References Cited

U.S. PATENT DOCUMENTS

| | | | |
|---|---|---|---|
| 4,820,942 | 4/1989 | Chan | 307/270 X |
| 4,825,099 | 4/1989 | Barton | 307/270 |
| 5,030,855 | 7/1991 | Leung | 307/475 |
| 5,166,555 | 11/1992 | Kano | 307/443 X |
| 5,198,700 | 3/1993 | Whiteside | 307/273 |

Primary Examiner—David R. Hudspeth
Attorney, Agent, or Firm—Bradley J. Botsch, Sr.

[57] ABSTRACT

An output driver stage (10) having current limit protection has been provided. The output driver stage provides current protection for both itself and for an output load which may be coupled to an output terminal (12). The current limit protection is accomplished via a one shot timer (28) which controls the charge at the output terminal. Further, the one shot timer may be activated by a plurality of output stages which respectively control a plurality of output loads.

8 Claims, 3 Drawing Sheets

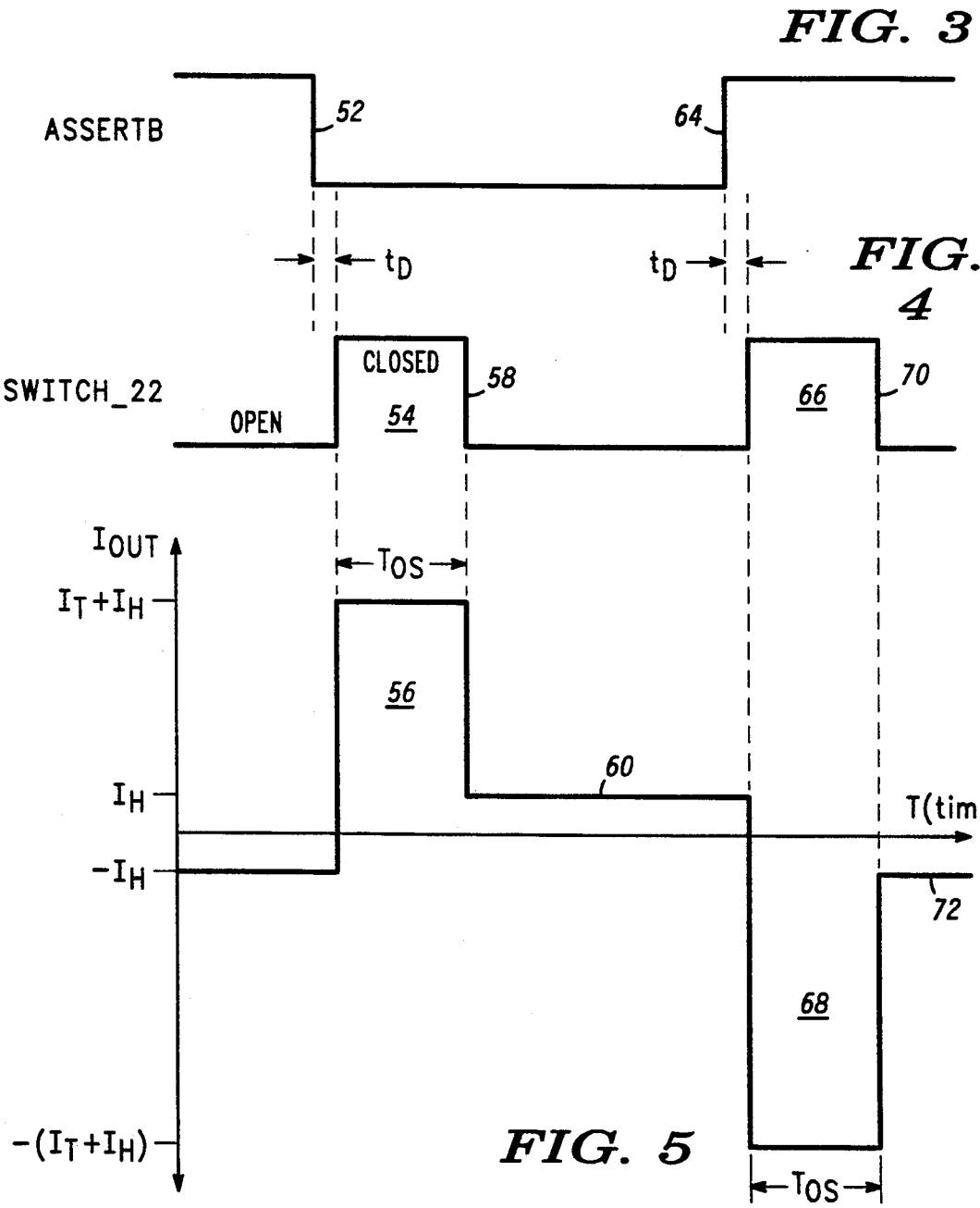

ent invention provides that switch 22 is closed only for
OUTPUT DRIVER STAGE WITH TWO TIER CURRENT LIMIT PROTECTION

FIELD OF THE INVENTION

This invention relates to output stages and, in particular, to an output driver stage with charge limiting protection.

BACKGROUND OF THE INVENTION

Output stages may be utilized to drive load transistors such as MOS transistors. The output stage provides high drive current to quickly switch a capacitive load. The output stage is typically current limited, either internally or externally, to prevent an output fault from damaging the output stage.

An external limiting element, for example, a resistor, is undesirable when full system integration is sought. Moreover, internal current limiting typically allows the output stage to draw a large amount of power under a fault condition such as a short to supply or ground. In addition, high power dissipation typically inhibits circuit operation.

Hence, there exists a need to provide an improved output driver stage having current limit protection and minimum power dissipation.

BRIEF DESCRIPTION OF THE DRAWINGS

FIGS. 2-5 are graphical diagrams illustrating typical waveforms occurring at selected nodes of the output driver stage of FIG. 1.

DETAILED DESCRIPTION OF THE DRAWINGS

Figure 1:
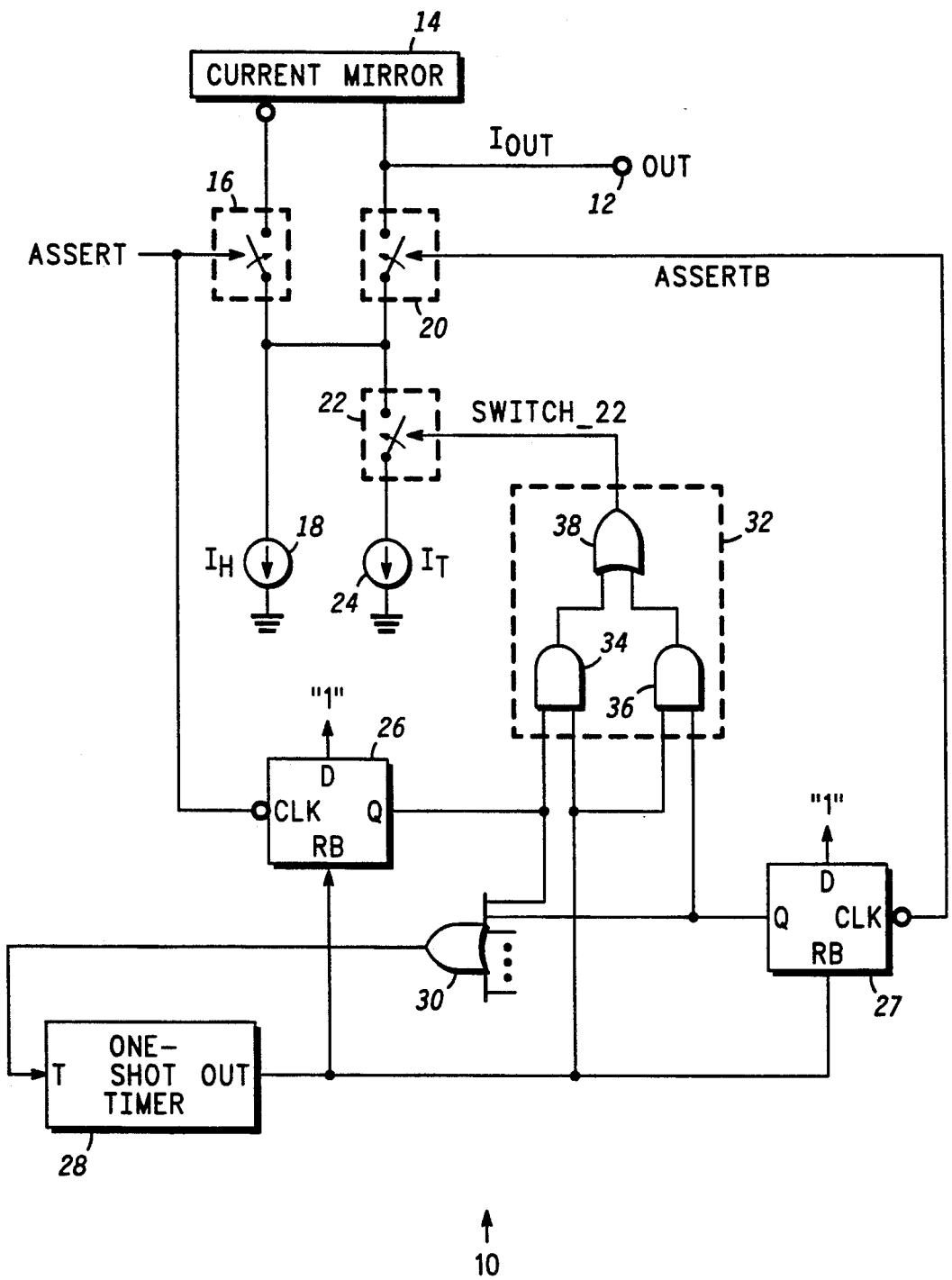
FIG. 1 is a detailed schematic/block diagram illustrating an output driver stage with two tier current limiting protection in accordance with the present invention.

Referring to FIG. 1, output driver stage 10 for providing two tier current limiting at terminal 12 is shown. Output driver stage 10 has an output stage including current mirror 14, switches 16, 20 and 22 and current sources 18 and 24. Current mirror 14 has an input coupled through switch 16 and current source 18 and finally returned to ground reference. The output of current mirror 14 is coupled through switches 20 and 22 and current source 24 and finally returned to ground reference. The output of current mirror 14 is also coupled to output terminal 12.

In particular, switch 16 has a first terminal coupled to the input of current mirror 14, and a second terminal coupled to a first terminal of current source 18. Switch 20 has a first terminal coupled to the output of current mirror 14, while the second terminal of switch 20 is coupled to a first terminal of switch 22 and to the second terminal of switch 16. Further, the second terminal of switch 22 is coupled to a first terminal of current source 24. The control terminal of switch 16 is coupled to receive logic signal ASSERT, while the control terminal of switch 20 is coupled to receive the complement of logic signal ASSERT as denoted by signal ASSERTB. The second terminals of current sources 18 and 24 are returned to ground reference.

Logic signal ASSERT is also applied to the clock input of D-flipflop 26 which is responsive to a negative going (high to low) transition. Similarly, logic signal ASSERTB is applied to the clock input of D-flipflop 27 which is also responsive to a negative going transition. The data inputs of D-flipflops 26 and 27 are coupled to receive a logic one ("1"), while the reset bar input as denoted by RB of each is coupled to an output of one shot timer 28. The output of D-flipflop 26 is coupled to a first input of OR gate 30, while the output of D-flipflop 27 is coupled to a second input of OR gate 30.

An output of OR gate 30 is coupled to a trigger input of one shot timer 28 wherein one shot timer 28 is triggered by a positive going (low to high) transition occurring at its trigger input. It is understood that the other inputs of OR gate 30 are respectively coupled to outputs of similar flipflops as D-flipflops 26 and 27 which are associated with other output driver stages (not shown) similar to output driver stage 10. Thus, it should be realized that OR gate 30 and one shot timer 28 are common circuitry for all output driver stages thereby reducing overall circuitry.

Logic circuit 32 includes AND gates 34 and 36 which have outputs coupled to the inputs of OR gate 38 whereby OR gate 38 provides a logic signal to the control terminal of switch 22. The first inputs of AND gates 34 and 36 are respectively coupled to the outputs of D-flipflop 26 and 27. The second inputs of AND gates 34 and 36 are coupled to the output of one shot timer 28.

Briefly, output driver stage 10 is designed to continue functioning even though an output load such as the gate terminal of a MOSFET (not shown) that is coupled to terminal 12 may not be operating properly, for example, it may be in a short circuit condition. To accomplish this, output driver stage 10 includes circuitry which functions to trigger one shot timer 28 whenever a logic transition (either a high to low transition or a low to high transition) occurs on logic signal ASSERT (and correspondingly ASSERTB). One shot timer 28 then provides a pulse width having a predetermined time length ($T_{OS}$), for example, a one microsecond pulse, which propagates through logic circuit 32 and closes switch 22 only for the time interval of the predetermined pulse width thereby providing current limit protection for switches 16, 20 and 22 and for a load (not shown) which may be coupled to terminal 12 by assuring that the transition current ($I_T$) is used to pull up (or pull down) the voltage at terminal 12 for only a specified period of time as defined by the time length ($T_{OS}$) of the pulse width of one shot timer 28. Thus, the present invention provides that switch 22 is closed only for a predetermined amount of time thereby limiting the charge delivered to terminal 12. It is understood that current $I_T$ is much greater than current $I_H$. For example, current $I_T$ may be on the order of 100 milliamps, while current $I_H$ may be on the order of 10 milliamps.

In particular, assume that logic signal ASSERT is switching from a logic low to a logic high and, thus, logic signal ASSERTB correspondingly switches from a logic high to a logic low. Referring to FIGS. 2-5, which shows a graphical diagram illustrating typical waveforms occurring at selected nodes of output driver stage 10 of FIG. 1, these logic transitions are respectively denoted by transitions 50 and 52 in FIGS. 2 and 3.

The logic high on signal ASSERT closes switch 16, while the logic low on signal ASSERTB opens switch 20. Further, the transition 52 on signal ASSERTB clocks flip flop 27 thereby providing a low to high transition at the output of flip flop 27 which propagates through OR gate 30 and triggers one shot timer 28. Thus, one shot timer 28 provides a predetermined pulse width signal to the second input of AND gate 36 which is AND'ed with the output of flip flop 27 to provide a predetermined pulse width signal to the control terminal of switch 22. As a result, switch 22 is only closed for a specified time interval which is substantially equal to the pulse width of one shot timer 28. Referring to FIG. 4, the signal appearing at the control terminal of switch 22 as denoted by signal SWITCH_22 is shown whereby pulse 54 occurs slightly after when signal ASSERTB goes low wherein time delay $t_D$ represents the delay of OR gate 30, one shot timer 28 and logic circuit 32. During this time that switch 22 is closed, output driver stage 10 functions to provide holding current $I_H$ plus transition current $I_T(I_H+I_T)$ at the input of current mirror 14 which is subsequently provided at the output of current mirror 14 ($I_{OUT}$) and is utilized to quickly pull up the voltage at terminal 12. This is denoted by pulse 56 on signal $I_{OUT}$ as shown in FIG. 5 wherein pulse 56 has a width substantially equal to the time length ($T_{OS}$) of the pulse width of one shot timer 28.

However when the output of one shot timer 28 transitions from a logic high to a logic low, pulse 54 goes away as denoted by high to low transition 58, switch 22 is opened and now the current provided at output terminal 12 is reduced to be substantially equal to the holding current $I_H$ as shown in FIG. 2D by line 60. The current at output terminal 12 will remain substantially equal to current $I_H$ until another logic transition occurs on signal ASSERT. Further, when the pulse appearing at the output of one shot timer 28 goes away, one shot timer 28 also functions to reset flip flops 26 and 27 and the other flip flops associated with the other output stages (not shown) by applying a logic low to the reset inputs (RB) of flip flops 26 and 27.

When it is desired to discharge the voltage appearing at terminal 12, that is to pull down on the voltage appearing at terminal 12, input logic signal ASSERT switches from a logic high to a logic low and correspondingly input logic signal ASSERTB switches from a logic low to a logic high as respectively denoted in FIGS. 2 and 3 by transitions 62 and 64.

The logic low on signal ASSERT opens switch 16, while the logic high on signal ASSERTB closes switch 20. Further, the transition 62 on signal ASSERT clocks flip flop 26 thereby providing a low to high transition at the output of flip flop 26 which propagates through OR gate 30 and triggers one shot timer 28. Thus, one shot timer 28 provides a predetermined pulse width signal to the second input of AND gate 34 which is AND'ed with the output of flip flop 26 to provide a predetermined pulse width signal to the control terminal of switch 22. As a result, switch 22 is only closed for a specified time interval which is substantially equal to the one shot time pulse width. Referring to FIG. 4, the closing of switch 22, which occurs time $t_D$ after transition 62, is shown by pulse 66 wherein time $t_D$ has already been defined. During this time that switch 22 is closed, output driver stage 10 functions to sink holding current $I_H$ plus transition current $I_T$ ($I_H+I_T$) from terminal 12 which is utilized to quickly pull down the voltage at terminal 12. This is denoted by pulse 68 on signal $I_{OUT}$ as shown in FIG. 5.

However, when the output of one shot timer 28 transitions from a logic high to a logic low, pulse 66 goes away as denoted by high to low transition 70, switch 22 is opened and now the current sunk at output terminal 12 is reduced to be substantially equal to the holding current $I_H$ as shown in FIG. 5 by line 72. The current at output terminal 12 will remain substantially equal to current $I_H$ until another logic transition occurs on signal ASSERT and the waveforms shown in FIGS. 2-5 will essentially repeat themselves.

Although only one output driver stage is shown, the present invention is efficiently utilized with circuits having multiple output capacitance driver stages whereby a fault in one or more outputs cannot inhibit the operation of the other outputs. As a result, the power dissipation under a fault condition must be minimized. Further, the load coupled to terminal 12 is typically capacitive in nature, but a small resistive component, such as a parasitic leakage current, must also be considered.

Figure 6:
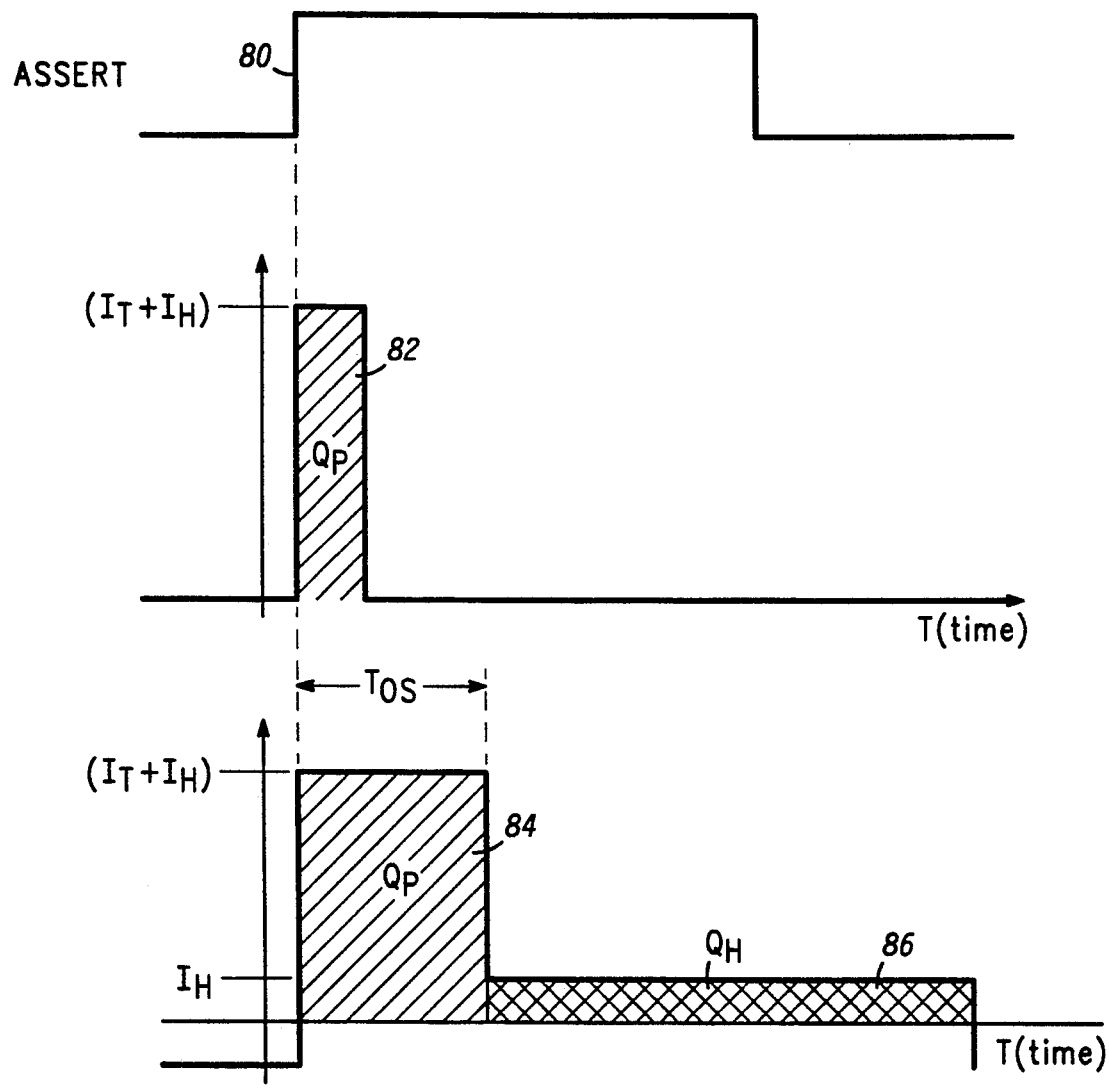
FIG. 6 is a graphical diagram illustrating the charge reduction achieved by the two tier current limiting protection.

Power dissipation in the output driver stage may be defined by the area under the output current ($I_{OUT}$) versus time waveform. In particular, this area is substantially equal to the total charge delivered to the load during one switching cycle. It should be realized from the above description that the present invention teaches a two tier current technique which may be used to tailor the charge profile appearing at terminal 12. Referring to FIG. 6, a graphical diagram illustrating the charge reduction achieved by the two tier current limit technique is shown. When a logic transition occurs on logic signal ASSERT as illustrated by transition 80, the normal charged delivered to a properly functional capacitive load ($Q_P$) is represented by the area of pulse 82 wherein the charge can be easily calculated by the product of the current delivered to terminal 12 ($I_T+I_H$) and the time that it is delivered. In particular, the time length of pulse 82 is essentially the time it normally takes to drive a functional load to a predetermined voltage as is understood. As can be seen, the time length is small which means that the normal power dissipation is also small.

However, if a load coupled to terminal 12 is in a fault condition, such as a short to supply or ground, it may take a substantially longer time to drive the voltage at terminal 12 to a predetermined voltage, or in fact, this predetermined voltage may never be attained. This will result in a large amount of power dissipation and overcurrent conditions. But in response, the present invention provides a transition charge ($Q_T$) as represented by the area of block 84, and a holding charge ($Q_H$) as represented by the area of block 86 wherein the transition charge is due to transition current ($I_T+I_H$) which appears at terminal 12 for only a short period of time ($T_{OS}$) and wherein the holding charge is due to holding current $I_H$. Thus, the higher transition current is delivered to terminal 12 for only a short period of time by limiting the amount of charge delivered to terminal 12 thereby providing current limit protection and minimum power dissipation.

In general, holding current $I_H$ (first tier current) holds the voltage across a load (coupled to terminal 12) at the proper level in case the load has a small resistive component. The magnitude of current $I_H$ is chosen to overdrive the maximum expected DC leakage current. Transition current $I_T+I_H$ (second tier current) is chosen to switch the capacitive load (coupled to terminal 12) at the desired slew rate. The transition current is only maintained long enough to guarantee that the voltage across the capacitive load is switched to the proper level. It should be realized that without this two tier current, the charge delivered to terminal 12 when a load coupled thereto was short circuited would be substantially larger because the transition current would always be applied to terminal 12.

Thus, the present invention provides a two tier current limit protection for the output stage and for an output load coupled to terminal 12 where a second tier current $(I_H+I_T)$ is provided for only a short time, while a first tier current $(I_H)$, which is substantially smaller current than the second tier current is provided for the remainder of the time. In other words, the present invention limits the amount of time that a charging (or discharging) current $(I_H+I_T)$ is delivered to terminal 12. That is, the charge (Q) which is delivered to terminal 12 is limited by utilizing one shot timer 28 to close switch 22 only for a predetermined amount of time. In particular, since $Q=(I_{OUT} \times T_{OS})$, by limiting the pulse width of one shot timer 28, the charge at terminal 12 can be limited by controlling the time that current $I_T$ is provided at terminal 12 thereby providing current limit protection for switches 16, 20 and 22 and for an output load coupled to terminal 12.

Further as aforementioned, the present invention may be easily and efficiently utilized for driving a plurality of output loads because OR gate 30 and one shot timer 28 are common for all output stages wherein flip flop 27 actually is associated with another output driver stage but is shown in FIG. 1 for descriptive purposes to illustrate that one shot timer 28 is triggered every time a logic transition occurs on signal ASSERT. Thus, for each output load to be driven, circuitry including current mirror 14, switches 16, 20 and 22, current sources 18 and 24 and flip flop 26 is needed. However, only one OR gate (30) and one shot timer (28) is needed. Thus, the present invention results in a substantial savings in circuitry especially when a plurality of outputs are required such as in an ink jet printer. Also, the present invention provides a substantial savings in power because now current $(I_H+I_T)$ is only provided for a short period of time as determined by the time of the one shot pulse width.

Further, the present invention does not disable current drive if an output load is faulty wherein the present invention still provides current but only for a short period of time.

It is worth noting that although FIG. 1 shows flip flops 26 and 27 which are responsive to logic signals ASSERT and ASSERTB for activating one shot timer 28 as aforedescribed, it should be understood that other simple logic circuitry may be utilized to achieve the same result which is to close switch 22 for a predetermined amount of time when a logic transition occurs on input signal ASSERT.

By now it should be apparent from the foregoing discussion that a novel output driver stage having current limit protection has been described. The output driver stage provides current protection for both itself and for an output load which may be coupled to an output terminal. The current limit protection is accomplished via a one shot timer which controls the charge time at the output terminal. Further, the one shot timer may be activated by a plurality of output stages which are respectively coupled to a plurality of output loads.

While the invention has been described in conjunction with specific embodiments thereof, it is evident that many alterations, modification and variations will be apparent to those skilled in the art in light of the foregoing description. Accordingly, it is intended to embrace all such alterations, modifications and variations in the appended claims.

I claim:

1. A circuit for providing a two tier current at an output, comprising:

a current mirror circuit having an input and an output, said output of said current mirror circuit being coupled to the output;

first current switching means responsive to an input logic signal for alternately supplying a first current at said input and said output of said current mirror circuit, said first current representing a first tier current, said first current switching means having first, second, third and fourth terminals, said first and second terminals of said first current switching means being respectively coupled to said input and said output of said current mirror circuit, said fourth terminal of said first current switching means being coupled to a first supply voltage terminal;

second current switching means responsive to a first logic signal for supplying a second current to be added to said first current when said first logic signal is in a first logic state, a sum of said first and second currents representing a second tier current, said second current switching means having first and second terminals, said first terminal of said second current switching means being coupled to said third terminal of said first current switching means, said second terminal of said second current switching means being coupled to said first supply voltage terminal; and circuit means for providing said first logic signal to said second current switching means, said first logic signal being in a first logic state for a predetermined time length whenever said input logic signal changes logic states.

2. The circuit according to claim 1 wherein said first current switching means includes:

a first switch having first and second terminals and a control terminal, said first terminal of said first switch being coupled to said first terminal of said first current switching means, said control terminal of said first switch being coupled to receive said input logic signal;

a second switch having first and second terminals and a control terminal, said first terminal of said second switch being coupled to said second terminal of said first current switching means, said second terminal of said second switch being coupled to said second terminal of said first switch and to said third terminal of said first current switching means, said control terminal of said second switch being coupled to receive a complement of said input logic signal; and a first current source for providing said first current and coupled between said second terminal of said first switch and said fourth terminal of said first current switching means.

3. The circuit according to claim 2 wherein said second current switching means includes:

a third switch having first and second terminals and a control terminal, said first terminal of said third switch being coupled to said first terminal of said second current switching means, said control terminal of said third switch being coupled to receive said first logic signal; and a second current source for providing said second current and coupled between said second terminal of said third switch and said second terminal of said second current switching means.

4. The circuit according to claim 3 wherein said circuit means includes:

flip flop means responsive to said input logic signal for providing a second logic signal, said second logic signal switching from a first logic state to a second logic state when said input logic signal changes logic states;

a one shot timer having a trigger input and an output, said trigger input of said one shot timer being coupled to receive said second logic signal, said output of said one shot timer providing a predetermined pulse width signal; and a logic circuit coupled to said flip flop means and to said output of said one shot timer, said logic circuit having an output for providing said first logic signal to said second current switching means.

5. A circuit for providing current at an output, comprising:

a current mirror circuit having an input and an output, said output of said current mirror circuit being coupled to the output;

a first switch having first and second terminals and a control terminal, said first terminal of said first switch being coupled to said input of said current mirror, said control terminal of said first switch being coupled to receive an input logic signal;

a second switch having first and second terminals and a control terminal, said first terminal of said second switch being coupled to said output of said current mirror, said second terminal of said second switch being coupled to said second terminal of said first switch, said control terminal of said second switch being coupled to receive a complement of said input logic signal;

a third switch having first and second terminals and a control terminal, said first terminal of said third switch being coupled to said second terminal of said second switch;

a first current source for providing a first current and coupled between said second terminal of said first switch and a first supply voltage terminal;

a second current source for providing a second current and coupled between said second terminal of said third switch and said first supply voltage terminal;

circuit means for providing a predetermined pulse width signal to said control terminal of said third switch whenever said input logic signal changes logic states such that a current substantially equal to a sum of said first and second currents flows at the output for a time interval substantially equal to a time length of said predetermined pulse width signal.

6. The circuit according to claim 5 wherein said circuit means includes:

a first flip flop circuit having data, clock and reset inputs, and an output, said clock input of said first flip flop circuit being coupled to receive said input logic signal, said data input of said first flip flop circuit being tied to a first logic state;

a one shot timer having a trigger input and an output, said trigger input of said one shot timer being coupled to said output of said first flip flop circuit, said output of said one shot timer being coupled to said reset input of said first flip flop circuit, said output of said one shot timer providing said predetermined pulse width signal; and a logic circuit having first and second inputs respectively coupled to said outputs of said first flip flop circuit and said one shot timer, said logic circuit having an output coupled to said control terminal of said third switch.

7. The circuit according to claim 5 wherein said circuit means includes:

a first flip flop circuit having data, clock and reset inputs, and an output, said clock input of said first flip flop circuit being coupled to receive said input logic signal, said data input of said first flip flop circuit being tied to a first logic state;

a second flip flop circuit having data, clock and reset inputs, and an output, said clock input of said second flip flop circuit being coupled to receive said complement of said input logic signal, said data input of said second flip flop circuit being tied to a first logic state;

a first logic circuit having a plurality of inputs and an output, a first one of said plurality of inputs being coupled to said output of said first flip flop circuit, a second one of said plurality of inputs being coupled to said output of said second flip flop circuit;

a one shot timer having a trigger input and an output, said trigger input of said one shot timer being coupled to said output of said first logic circuit, said output of said one shot timer being coupled to said reset inputs of said first and second flip flop circuits; and a second logic circuit having first and second inputs respectively coupled to said outputs of said first flip flop circuit and said one shot timer, said second logic circuit having third and fourth inputs respectively coupled to said outputs of said second flip flop circuit and said one shot timer, said second logic circuit having an output coupled to said control terminal of said third switch, said output of said second logic circuit providing said predetermined pulse width signal.

8. A method for providing a two tier current for protecting an output driver stage, the output driver stage being responsive to an input logic signal for providing current at an output terminal, the method comprising the steps of:

(a) activating a timer in response to a logic transition occurring on the input logic signal, said timer being active for a predetermined time length after each transition occurring on the input logic signal;

(b) providing a first current at the output terminal for said predetermined time length that said timer is active such that a charge delivered to the output terminal due to said first current is limited by said predetermined time length;

(c) providing a second current at the output terminal after said predetermined time length has elapsed, said second current representing a first tier current and said first current representing a second tier current wherein said first tier current is substantially smaller in magnitude than said second tier current.

* * * * *